United States Patent
Archambeault et al.

(10) Patent No.: US 6,377,474 B1
(45) Date of Patent: Apr. 23, 2002

(54) ELECTRICAL GROUNDING SCHEMES FOR SOCKETED PROCESSOR AND HEATSINK ASSEMBLY

(75) Inventors: Bruce Roy Archambeault, Durham; Joseph Curtis Diepenbrock, Raleigh; Leonard Douglas Hobgood, Durham; Joseph Anthony Holung, Wake Forest; Tin-Lup Wong, Chapel Hill, all of NC (US)

(73) Assignee: International Business Corporation, Armonk, NY (US)

( * ) Notice: Subject to any disclaimer, the term of this patent is extended or adjusted under 35 U.S.C. 154(b) by 0 days.

(21) Appl. No.: 09/483,796

(22) Filed: Jan. 13, 2000

(51) Int. Cl.[7] .............................. H05K 9/00; H05K 7/10; H05K 7/20
(52) U.S. Cl. ........................ 361/818; 361/719; 439/108; 439/487; 439/947
(58) Field of Search ................................ 361/704, 707, 361/710, 715, 753, 799, 816, 818, 719, 720, 709; 174/35 R, 51; 439/485, 487, 92, 94–96, 105, 108, 941, 947

(56) References Cited

U.S. PATENT DOCUMENTS

| 3,951,495 | A |   | 4/1976  | Donaher et al. |
|-----------|---|---|---------|----------------|
| 4,045,105 | A |   | 8/1977  | Lee et al. |
| 5,357,404 | A | * | 10/1994 | Bright et al. ............... 361/818 |
| 5,523,527 | A |   | 6/1996  | Mann et al. |
| 5,562,462 | A |   | 10/1996 | Matsuba et al. |

\* cited by examiner

*Primary Examiner*—Jeffrey Gaffin
*Assistant Examiner*—John B. Vigushin
(74) *Attorney, Agent, or Firm*—George E. Grosser; Andrew Dillon

(57) ABSTRACT

A computer processor socket has a base with grounding and signal holes. Each hole contains a pin for electrical interconnection with a circuit board. The socket also contains a grounding device around its perimeter. The grounding device has a continuous ring of wiping members on its upper end. When a processor is mounted to the top of the socket, the wiping members extend slightly above the processor. The heatsink mounted on top of the processor engages the wiping members which are spring-biased against its lower surface. Since the wiping members extend completely around the perimeter of the socket, a continuous electrical ground interface is formed between the heatsink and the socket. The lower ends of the grounding device are electrically interconnected with the socket grounding pins which are grounded to the board.

21 Claims, 4 Drawing Sheets

ELECTRICAL GROUNDING SCHEMES FOR SOCKETED PROCESSOR AND HEATSINK ASSEMBLY

BACKGROUND OF THE INVENTION

1. Technical Field

This invention relates in general to computer processor sockets and in particular to a computer processor socket with enhanced electrical grounding capabilities. Still more particularly, the invention relates to devices and methods for enhancing the electromagnetic grounding capabilities of computer processor sockets that utilize heat dissipation equipment.

2. Description of the Related Art

As the speed or frequency of computer processors increases, so do the electromagnetic (EM) emissions that interfere with computer operations. Thus, maintaining EM emissions within acceptable or legal limits has become a greater challenge to computer system designers. Unfortunately, as socketed processors approach speeds in the range of 1 GHz and beyond, complex emissions and shielding effectiveness relationships develop between the processor and its associated heat dissipation device regarding the number and location of grounding points therebetween.

Present EM mitigation schemes include utilizing direct grounding pins and/or planes in the processor and socket assembly, along with corresponding grounding paths in the planar board. These grounding features are typically augmented with additional external grounding points (e.g., wires, clips, shields, etc.) as needed. Unfortunately, using existing grounding methods to control the emissions of high speed processor assemblies is predicted to have several disadvantages. For example, increasing the complexity of grounding schemes will potentially require iterative evaluation during product development, and testing cannot be reasonably accommodated given the short product development cycle. If a grounding scheme is found to be insufficient, it is difficult and time-consuming to make a change and retest the solution, due to the need for changes to the planar board design and the associated components. If a processor change is implemented (e.g., clock frequency change, upgrade, or other change), the previous grounding method may not work. If the design or availability of a heatsink changes, the existing grounding components (e.g., wires, clips, shields) are unlikely to fit the substitute heatsink, and additional time and effort will be needed to accommodate it. Furthermore, the grounding scheme for the processor and heatsink assembly is typically planar-dependent and requires a unique grounding solution for each system within which it is installed.

Accordingly, it is an object of the invention to provide an improved computer processor and socket assembly.

It is an additional object of the invention to provide a computer processor and socket assembly with enhanced electrical grounding capabilities.

Still another object of the invention is to provide devices and methods for enhancing the electromagnetic emissions grounding capabilities of computer processor and socket assemblies that utilize heat dissipation equipment.

The foregoing and other objects and advantages of the present invention will be apparent to those skilled in the art, in view of the following detailed description of the preferred embodiment of the present invention, taken in conjunction with the appended claims and the accompanying drawings.

SUMMARY OF THE INVENTION

A socket for a computer processor has a base with grounding holes and signal holes. Each hole contains a pin for electrical interconnection with a circuit board. The socket also contains a grounding device extending around its perimeter. The grounding device has flexible wiping members on its upper end that are joined together to form a continuous ring above the base. Alternatively, the wiping members may also be formed as discrete members. When a processor is mounted to the top of the socket, the wiping members extend slightly above the processor. The heatsink mounted on top of the processor engages the wiping members which are spring-biased against its lower surface to form an electrical ground. Since the wiping members extend completely around the perimeter of the socket, a continuous electrical ground interface is formed between the heatsink and the socket. The lower ends of the grounding device are electrically interconnected with the socket grounding pins which are grounded to the board. Alternatively, the lower ends of the grounding device may be spring-biased against grounding pads on the surface of the circuit board.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

DETAILED DESCRIPTION OF THE PREFERRED EMBODIMENT

Figure 1:
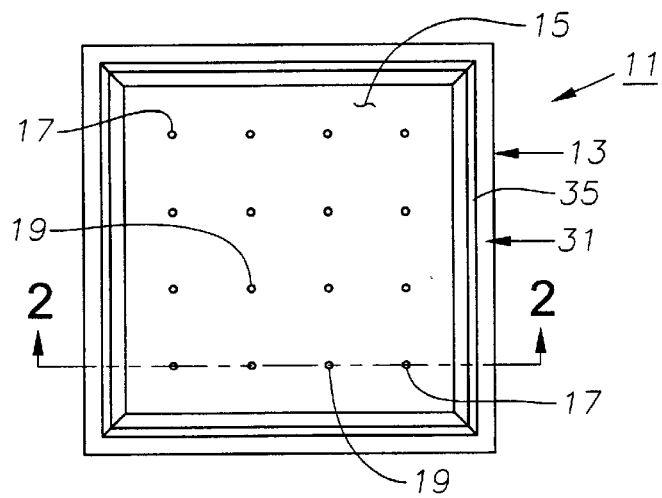
FIG. 1 is a schematic top view of a first embodiment of a computer processor socket constructed in accordance with the invention.

Referring to FIG. 1, a first embodiment of a computer processor socket 11 is shown. Socket 11 is illustrated in a very simplified form to better facilitate understanding of the invention. Socket 11 has an insulated base 13 with a generally flat, rectangular profile. The upper surface 15 of socket 11 has a number of grounding holes 17 and signal holes 19 arrayed therebetween. Only a few grounding holes 17 (one in each corner) and signal holes 19 are shown. Each hole 17, 19 has an electrical pin 21 (FIG. 2) located therein that extends below the bottom surface 23 of base 13.

Figure 2:
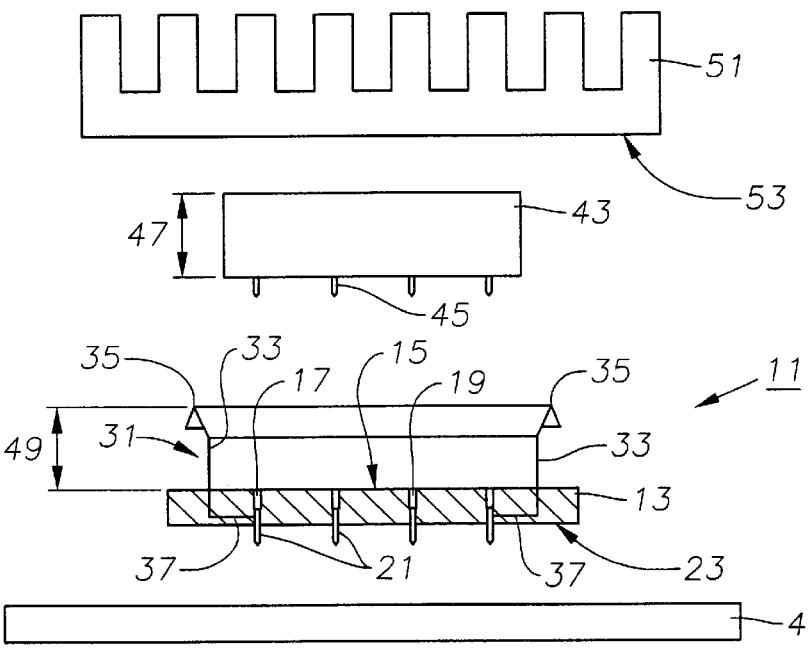
FIG. 2 is a sectional side view of the socket of FIG. 1 taken along the line 2—2 of FIG. 1 and shown exploded with side views of additional interconnecting components.

As shown in FIGS. 1 and 2, socket 11 also has an electrical grounding device 31 formed therein. Device 31 is generally rectangular in shape with upright sidewalls 33 (FIG. 2) extending upward from base 13. Sidewalls 33 extend completely around the perimeter of socket 11. The upper end of each sidewall 33 terminates in a flexible wiping member 35. Wiping members 35 are contiguously joined to one another (FIG. 1) to form a ring or "fence" that is elevated above upper surface 15. The lower ends of sidewalls 33 are electrically interconnected to the pins 21 in the grounding holes 17 via discrete electrical conductors 37.

Figure 3:
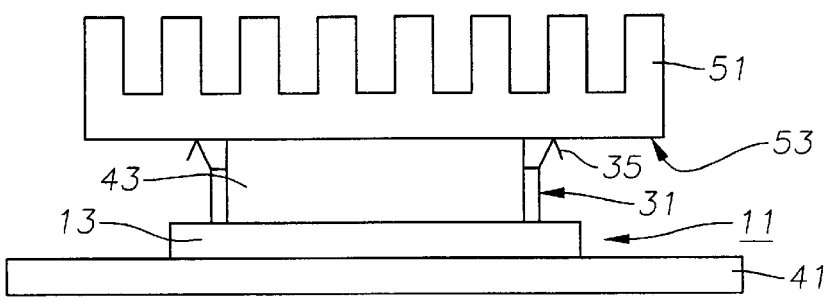
FIG. 3 is a schematic side view of the socket and components of FIG. 2 shown interconnected.

Referring now to FIGS. 2 and 3, bottom surface 23 of socket 11 is designed to be mounted to a printed circuit board 41 such that pins 21 electrically interconnect with appropriate circuits in board 41. Socket 11 acts as a connector for attaching a computer processor 43 to board 41. Processor 43 has a large number of fine electrical grounding and signal pins 45 (only a few are shown) that extend from its lower surface for inserting into respective ones of holes 17, 19 in base 13. Processor 43 electrically interconnects with socket 11 and, thus, board 41 when it is mounted thereto.

Processor 43 has a vertical dimension 47 that is slightly smaller than the vertical dimension 49 of grounding device 31 when wiping members 35 are in their naturally extended positions. Thus, when a heat dissipation device or heatsink 51 is mounted to the top of processor 43, wiping members 35 deflect slightly downward. Heatsink 51 may be joined to processor 43 and the assembly in a manner such as those commonly employed in the art. Grounding device 31 is spring-biased to maintain physical contact with the lower surface 53 of heatsink 51 at all times, and is always free of physical contact with processor 43. Since wiping members 35 extend completely around the rectangular perimeter of socket 11, a continuous electrical ground interface is formed between heatsink 51 and socket 11 to complete the computer processor cartridge assembly.

Figure 4:
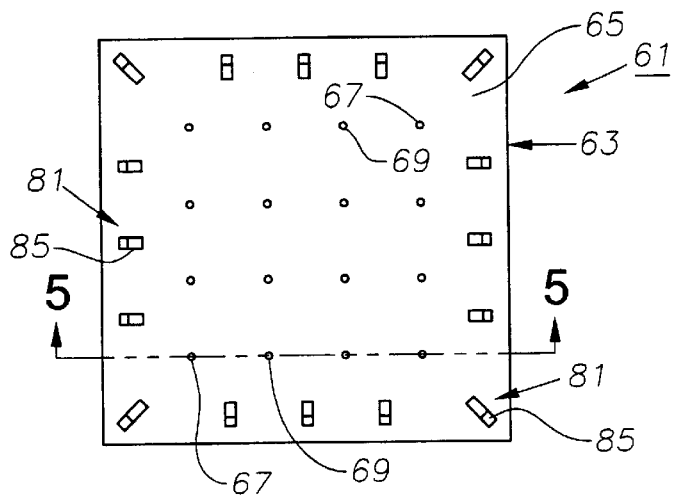
FIG. 4 is a schematic top view of a second embodiment of the processor socket of FIG. 1.
Figure 5:
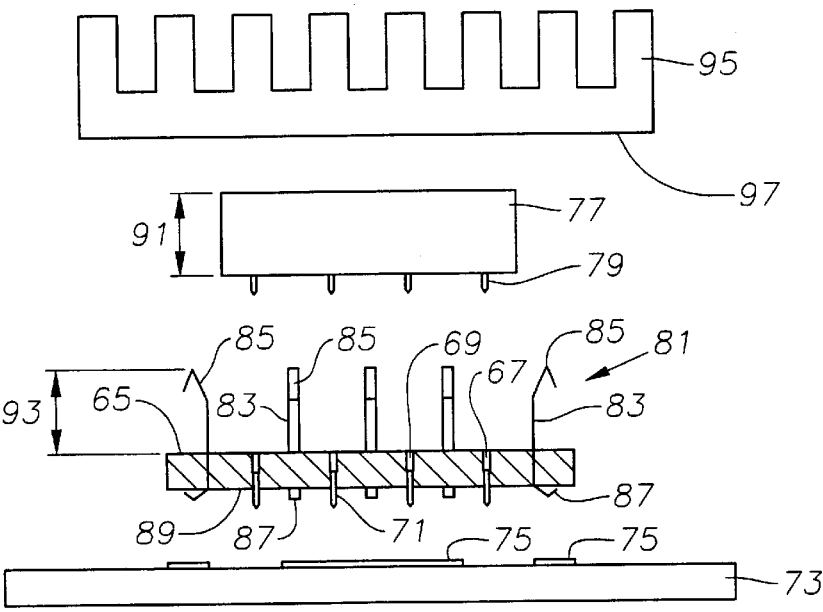
FIG. 5 is a sectional side view of the socket of FIG. 4 taken along the line 5—5 of FIG. 4 and shown exploded with side views of additional interconnecting components.

Referring now to FIG. 4, a second embodiment of the invention is shown as processor socket 61. Socket 61 has a base 63 with an upper surface 65 containing a number of grounding holes 67 and signal holes 69. Each hole 67, 69 has an electrical pin 71 (FIG. 5) located therein for interconnecting with respective electrical circuits in a circuit board 73. As shown in FIGS. 4 and 5, socket 61 also has a series of discrete, spring-like, electrical grounding devices 81 formed therein. Grounding devices 81 are symmetrically spaced apart adjacent to the perimeter of base 63. Socket 61 may be provided with more or fewer devices 81, depending upon the application. In the embodiment shown, each device 81 is generally C-shaped with a midportion 83 (FIG. 5) extending upward from base 63. The upper end of each midportion 83 terminates in a flexible wiping member 85. Wiping members 85 form an array that is elevated above upper surface 65. The lower ends of midportions 83 terminate in discrete, flexible contacts 87 that form an array adjacent to a bottom surface 89 of base 65.

Figure 6:
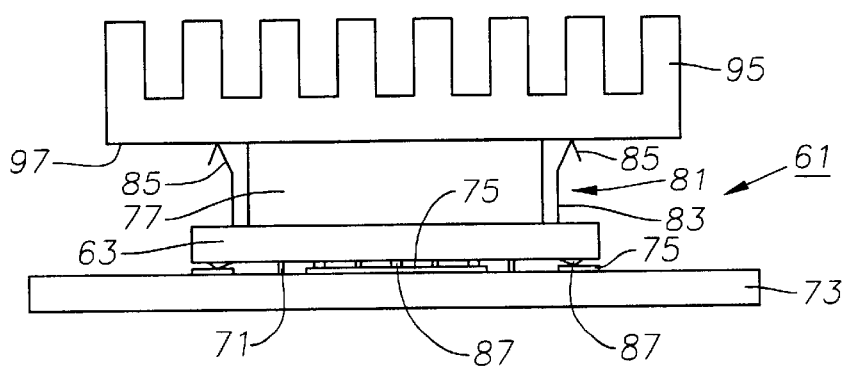
FIG. 6 is a schematic side view of the socket and components of FIG. 5 shown interconnected.

Referring now to FIGS. 5 and 6, contacts 87 on bottom surface 89 are designed to flexibly engage grounding pads 75 on circuit board 73. Pads 75 may be discrete, continuous, or used in combination, depending upon the application. Socket 61 acts as a connector for attaching a computer processor 77 to board 73. Processor 77 has a large number of fine electrical grounding and signal pins 79 (only a few are shown) that extend from its lower surface for inserting into respective ones of holes 67, 69 in base 63. Processor 77 electrically interconnects with socket 61 and, thus, board 73 when it is mounted thereto.

Processor 77 has a vertical dimension 91 that is slightly smaller than the vertical dimension 93 of grounding device 81 when wiping members 85 are in their naturally extended positions. Thus, when a heatsink 95 is mounted to the top of processor 77, wiping members 85 deflect slightly downward, but are always free of physical and electrical contact with processor 77, and electrical contact with the components of socket 61. Grounding device 81 is spring-biased to maintain physical contact with the lower surface 97 of heatsink 95 and pads 75 on board 73 at all times. Since devices 81 are spaced completely around the rectangular perimeter of socket 61, an extensive electrical ground interface is formed between heatsink 95 and socket 61.

Figure 7:
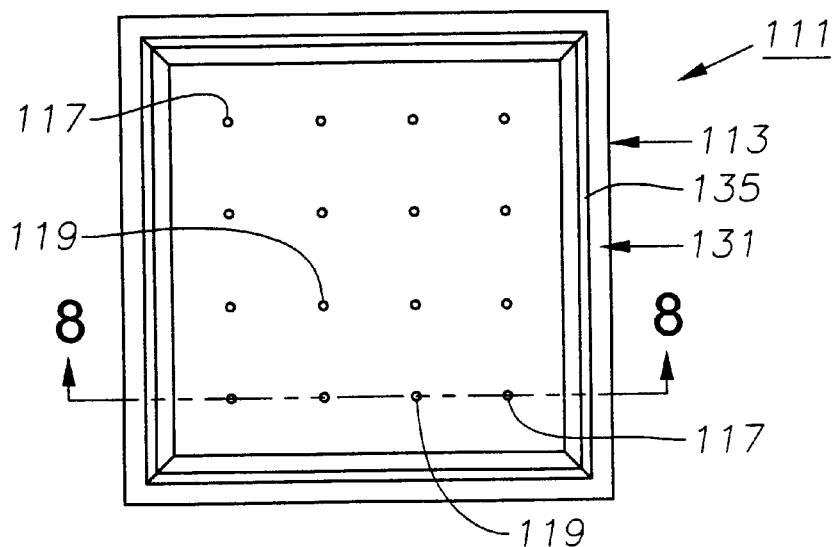
FIG. 7 is a schematic top view of a third embodiment of the processor socket of FIG. 1.
Figure 8:
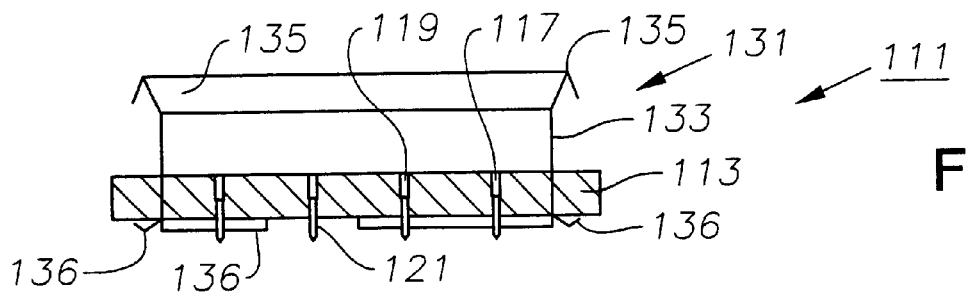
FIG. 8 is a sectional side view of the socket of FIG. 7 taken along the line 8—8 of FIG. 7.
Figure 9:
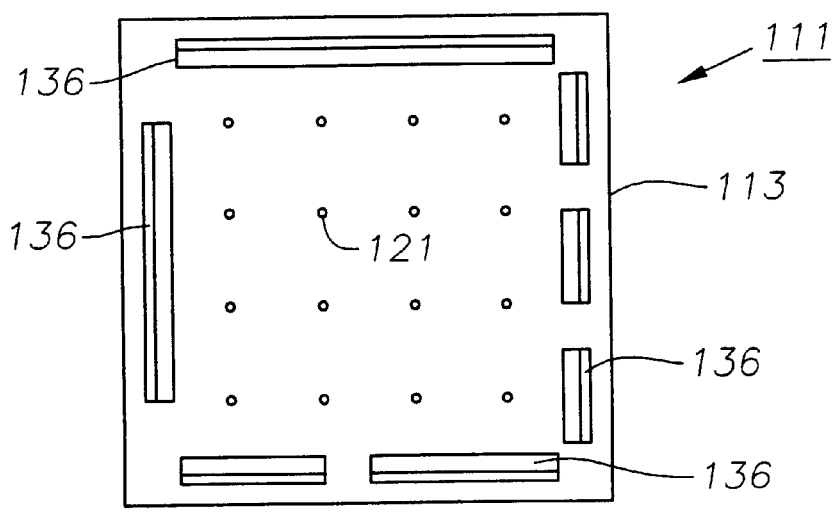
FIG. 9 is a schematic bottom view of the processor socket of FIG. 7.

Referring now to FIG. 7, a third and preferred embodiment of the invention is shown as processor socket 111. Socket 111 has a base 113 with grounding holes 117 and signal holes 119. Each hole 117, 119 has an electrical pin 121 (FIG. 8) located therein for interconnecting with a circuit board 123. As shown in FIGS. 7–9, socket 111 also has a spring-like electrical grounding device 131 formed therein. When viewed from above (FIG. 7), grounding device 131 is generally rectangular in shape with upright sidewalls 133 (FIG. 8) extending upward from base 113. Sidewalls 133 extend completely around the perimeter of socket 111. The upper end of each sidewall 133 terminates in a flexible wiping member 135. Wiping members 135 are contiguously joined to one another (FIG. 7) to form a ring or "fence" that is elevated above base 113.

Figure 10:
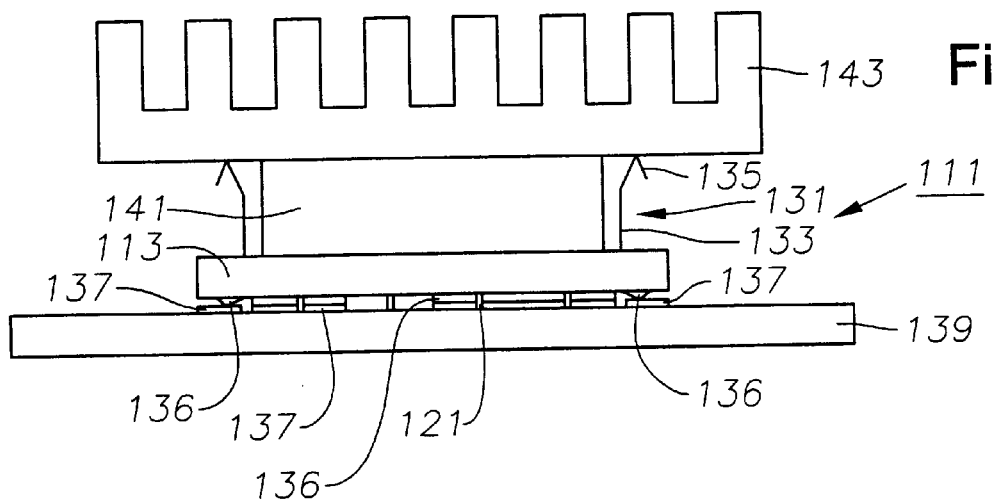
FIG. 10 is a schematic side view of the socket of FIG. 7 shown interconnected with other components.

As shown in FIG. 9, the lower ends of sidewalls 133 are segmented into flexible, asymmetrical, electrical contacts 136 for contacting grounding pads 137 on circuit board 139 (FIG. 10). Contacts 136 are precisely configured to the size and shape of the space available for pads 137. The pattern of contacts 137 illustrated in FIG. 9 is merely one of an almost infinite number of configurations that may be used obviously, socket 111 may be provided with more or fewer contacts 136 with varying lengths, depending upon the application. In the embodiment shown, device 131 has a generally C-shaped cross-section.

Referring again to FIG. 10, contacts 137 on the bottom of socket 111 are designed to flexibly engage pads 137 on board 139. Pads 137 may be discrete, continuous, or used in combination, depending upon the application. Socket 111 acts as a connector for attaching a computer processor 141 to board 139. Processor 141 has electrical grounding and signal pins (not shown) that extend from its lower surface for inserting into respective ones of holes 117, 119 in base 63. Processor 141 electrically interconnects with socket 111 and, thus, board 139 when it is mounted thereto.

The vertical dimension of device 131 above base 113 is slightly greater than the vertical dimension of processor 141 when wiping members 135 are extended. Wiping members 135 deflect when a heatsink 143 is mounted on top of processor 141. Contacts 136 and pads 137 have minimal vertical dimensions so as to permit electrical interconnection between pins 121 and circuit board 139. After assembly, grounding device 131 is spring-biased to maintain physical contact with heatsink 143 and pads 137 on board 139 at all times. Grounding device 131 is completely free of contact with processor 141. Since wiping members 135 extend completely around the upper rectangular perimeter of socket 111, a continuous electrical ground interface is formed between heatsink 151 and socket 111. The electrical ground interface between socket 111 and board 139 is substantial due to the width of contacts 136 and pads 137, respectively.

Figure 11:
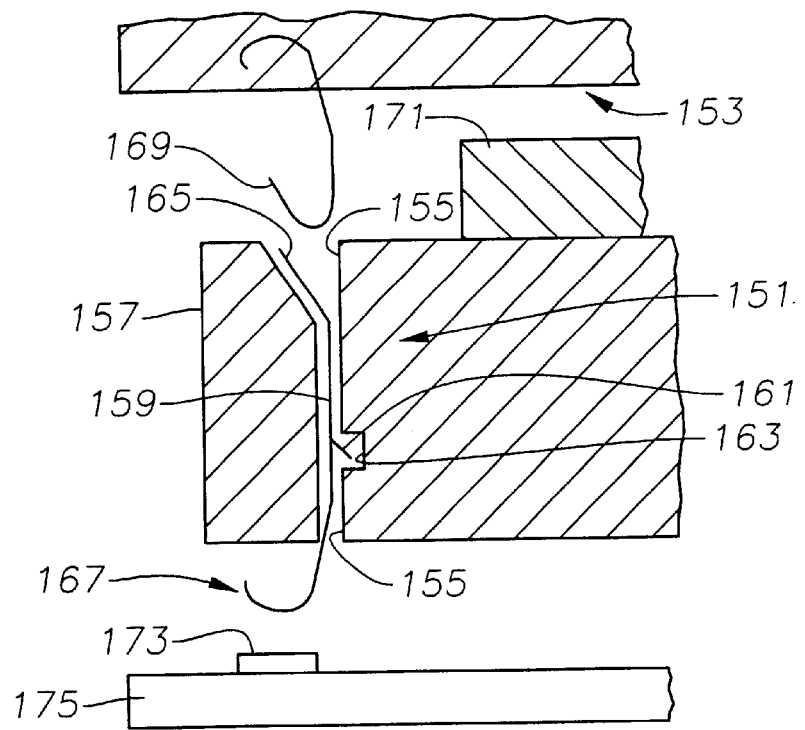
FIG. 11 is an enlarged, partial sectional side view of a fourth embodiment of the processor socket of FIG. 1.

Referring now to FIG. 11, an alternate configuration for grounding a socket 151 and a heatsink 153 is shown. Socket 151 is provided with either a continuous slot or discrete holes 155 near its outer perimeter 157. A flexible grounding member 159 is captured within hole 155 and, in the version illustrated, has a barb 161 seated within a groove 163 in hole 155. The upper end 165 of member 159 is tapered to the shape of hole 155 while the flexible lower end 167 of member 159 protrudes therefrom. When heatsink 153 is joined to the processor 171 on top of socket 151, the upper end 165 slidingly engages a flexible wiping member 169 protruding from the lower surface of heatsink 153. Wiping member 169 may be molded within or otherwise joined to heatsink 153. Lower end 167 contacts a grounding pad 173 on circuit board 175 when socket 151 is mounted thereto. Thus, an EM shielding or grounding circuit is formed between heatsink 153, socket 151 and board when they are assembled.

Note that grounding member 159 and wiping member 169 may be formed as discrete, continuous, or segmented elements as described above for the electrical contacting members of the previous embodiments. In addition, portions or all of this alternate configuration of FIG. 11 may be readily employed in any of the previous embodiments described above. For example, upper end 165 and wiping member 169 may be employed in all of previous embodiments, and the entire configuration may be employed in the second and third embodiments.

The invention has several advantages. The first embodiment has a convenient, multi-point grounding scheme that is achieved directly as the bottom surface of the heatsink comes into electrical contact with the extended wiping surfaces of the grounding device on the socket. This design works with any existing heatsink and circuit board and requires no modifications thereof. If an adequate number of grounding pins are unavailable in the socket and/or the interfacing perimeter footprint on the circuit board, the second embodiment provides grounding devices that can be selectively added as needed to achieve the desired degree of EM shielding. Unlike the first embodiment, the devices of the second embodiment provide optional plug-in grounding that is independent of the existing grounding holes and pins in the socket. The optimum number of grounding devices can be determined and selectively applied in a particular system or socket as needed, making the socket easier to build. In addition, processor changes and/or upgrades can also be easily handled. The third and preferred embodiment has optimized grounding capabilities with a continuous wiping ring on top of the socket for the heatsink, and maximum multi-point contacts on the bottom of the socket for the circuit board. Again, processor changes or upgrades require no additional changes to the grounding scheme.

While the invention has been shown or described in only some of its forms, it should be apparent to those skilled in the art that it is not so limited, but is susceptible to various changes without departing from the scope of the invention.

What is claimed is:

1. A computer processor assembly, comprising in combination:

a processor having a plurality of electrical contacts extending therefrom;

a heat dissipation device mounted to the processor;

a socket having a plurality of receptacles for receiving respective ones of the electrical contacts on the processor, and an electrical element extending from each of the receptacles, each of the electrical elements being adapted to be electrically interconnected to a circuit board;

a grounding device mounted to the socket and having a wiping member extending toward and biased against the heat dissipation device to maintain electrical continuity therewith; wherein the grounding device is adapted to be electrically interconnected to the circuit board to complete a grounding circuit between the heat dissipation device and the circuit board; and wherein the wiping member forms a continuous ring of contact with the heat dissipation device.

2. The computer processor assembly of claim 1 wherein the wiping member is located adjacent to a perimeter of the socket and surrounds the processor.

3. The computer processor assembly of claim 1 wherein the wiping member is interconnected to at least some of the electrical elements in the receptacles of the socket to complete the grounding circuit.

4. The computer processor assembly of claim 1 wherein the grounding device extends through an interior of the socket and is adapted to directly ground with the circuit board.

5. The computer processor assembly of claim 1 wherein the grounding device has a plurality of segmented contacts located opposite the wiping member and which are adapted to engage the circuit board.

6. The computer processor assembly of claim 5 wherein both the wiping member and the segmented contacts are flexibly biased.

7. The computer processor assembly of claim 1 wherein the grounding device is free of electrical contact with the processor and the electrical elements of the socket.

8. A computer processor socket for interconnecting a computer processor to a circuit board, the processor having a perimeter, grounding pins, signal pins, and a heat dissipation device mounted to the processor, comprising:

a base having a plurality of grounding and signal holes that are adapted to receive respective ones of the grounding and signal pins on the processor, and an electrical pin extending from each of the holes away from the base, each of the electrical pins being adapted to be electrically interconnected to the circuit board;

a grounding device mounted to the base and adapted to surround the perimeter of the processor while remaining free of physical contact with the processor, the grounding device having a wiping member that is adapted to be biased against the heat dissipation device to maintain electrical continuity therewith; wherein the grounding device extends through an interior of the base and is adapted to be electrically interconnected to the circuit board to complete a grounding circuit between the heat dissipation device and the circuit board; and wherein the wiping member is flexibly biased and adapted to extend beyond the processor prior to engaging the heat dissipation device and become coplanar with the processor after engaging the heat dissipation device.

9. The computer processor socket of claim 8 wherein the wiping member of the grounding device is adapted to form a continuous ring of contact with the heat dissipation device.

10. The computer processor socket of claim 8 wherein the wiping member is electrically interconnected to at least some of the pins in the grounding holes of the base to complete the grounding circuit.

11. The computer processor socket of claim 8 wherein the grounding device has a set of segmented contacts located opposite the wiping member.

12. The computer processor socket of claim 11 wherein the segmented contacts are asymmetrical and flexible.

13. The computer processor socket of claim 8 wherein the grounding device is adapted to be free of electrical contact with the processor and the electrical pins of the base.

14. A computer processor socket for interconnecting a computer processor to a circuit board, the processor having a perimeter, grounding pins, signal pins, and a heatsink mounted to the processor, comprising:

a base having a plurality of grounding and signal holes that are adapted to receive respective ones of the grounding and signal pins on the processor, and an electrical pin extending from each of the holes away from the base, each of the electrical pins being adapted to be electrically interconnected to the circuit board;

a grounding device adapted to surround the perimeter of the processor while remaining free of electrical contact with the electrical pins of the base, and physical and electrical contact with the processor, the grounding device having a wiping member that is adapted to contact the heatsink and maintain electrical continuity therewith, and a plurality of electrical contacts located opposite the wiping member that are adapted to be electrically interconnected to the circuit board to complete a grounding circuit between the heatsink and the circuit board; and wherein the wiping member comprises a discrete first element that is adapted to be secured to the heatsink, and a discrete second element, discontinuous with the first element, secured to the base, and wherein the first and second elements are adapted to electrically interconnect when the heatsink is mounted to the processor on the base.

15. The computer processor socket of claim 14 wherein the first element of the wiping member is adapted to form a continuous ring of contact with the heatsink.

16. The computer processor socket of claim 14 wherein the electrical contacts of the grounding device are symmetrically arrayed.

17. The computer processor socket of claim 14 wherein the electrical contacts of the grounding device are asymmetrical and segmented.

18. A method for electrically grounding a computer processor assembly to reduce the electromagnetic emissions thereof, comprising the steps of:

(a) providing a computer processor socket having a perimeter, a plurality of receptacles with electrical elements located within the perimeter, and a grounding device mounted thereto and extending around the perimeter;

(b) mounting a processor to the socket such that the grounding device surrounds the processor and wherein electrical contacts of the processor interconnect with respective ones of the receptacles in the socket;

(c) mounting a heatsink to the processor such that the grounding device flexibly engages the heatsink and forms a continuous ring of electrical grounding contact with the heatsink about the processor while remaining free of contact with the processor; and (d) mounting the socket to circuit board such that the grounding device forms a grounding circuit between the heatsink and the circuit board by interconnecting the grounding device to at least some of the electrical elements in the receptacles of the socket to complete the grounding circuit.

19. The method of claim 18 wherein step (d) comprises extending the grounding device through an interior of the socket directly into grounding contact with the circuit board.

20. The method of claim 18 wherein step (d) comprises forming a flexibly biased array of asymmetrical, segmented contacts with the circuit board.

21. The method of claim 18 wherein step (d) comprises forming the grounding circuit while remaining free of electrical contact with the electrical elements of the socket.

* * * * *